United States Patent [19]
Suzuki

[11] Patent Number: 6,078,085
[45] Date of Patent: Jun. 20, 2000

[54] SEMICONDUCTOR INTEGRATED CIRCUIT AND LAYOUT APPARATUS IN WHICH GUARD-RING IS INTERPOSED BETWEEN INPUT-OUTPUT CIRCUITS

[75] Inventor: Hajime Suzuki, Tokyo, Japan

[73] Assignee: Oki Electric Industry Co., Ltd., Tokyo, Japan

[21] Appl. No.: 09/135,551

[22] Filed: Aug. 18, 1998

[30] Foreign Application Priority Data

Nov. 4, 1997 [JP] Japan ..................................... 9-301947

[51] Int. Cl.[7] ............................ H01L 23/62; H01L 29/76; H01L 29/94
[52] U.S. Cl. ........................... 257/369; 257/355; 257/357; 257/358; 257/339; 257/372; 257/396; 257/394; 257/127; 257/452; 257/484; 257/490
[58] Field of Search ..................................... 257/369, 357, 257/355, 127, 339, 372, 394, 396, 452, 484, 490

[56] References Cited

U.S. PATENT DOCUMENTS 5,780,887   7/1998   Nakagawa et al. ...................... 257/298
5,828,109  10/1998   Okamoto .................................. 257/372

OTHER PUBLICATIONS

H.B. Bakoglu, "Circuits, Interconnections and Package for VLSI" with English Translation.

*Primary Examiner*—Carl Whitehead, Jr.
*Assistant Examiner*—Matthew Warren
*Attorney, Agent, or Firm*—Jones Volentine, LLP

[57] ABSTRACT

A semiconductor integrated circuit is made up of a plurality of input-output circuit portions which are aligned at irregular intervals between a core portion and an external portion, a first guard-ring which is formed in the respective input-output circuit portions, and a second guard-ring which is formed between the respective input-output circuit portions. Accordingly, the semiconductor integrated circuit can prevent latch-up between the respective input-output circuit portions without changing the layout of the respective input-output circuit portions.

8 Claims, 4 Drawing Sheets

SEMICONDUCTOR INTEGRATED CIRCUIT AND LAYOUT APPARATUS IN WHICH GUARD-RING IS INTERPOSED BETWEEN INPUT-OUTPUT CIRCUITS

BACKGROUND OF THE INVENTION

1. Field of the Invention

The present invention generally relates to a semiconductor integrated circuit, to a layout method of a semiconductor integrated circuit, and to a layout apparatus of a semiconductor integrated circuit. More particularly, the present invention relates to a semiconductor integrated circuit, a layout method of the semiconductor integrated circuit, and a layout apparatus of the semiconductor integrated circuit, in which a second guard-ring is formed between respective input-output circuit portions.

This application is a counterpart of Japanese application Serial Number 301947/1997, filed Nov. 4, 1997, the subject matter of which is incorporated herein by reference.

2. Description of the Related Art

In general, in a conventional semiconductor integrated circuit having a CMOS circuit, there is a need to prevent latch-up. Latch-up occurs in a core portion that is made up of a main circuit of the semiconductor integrated circuit. Latch-up also occurs in an input-output circuit portion located between the core portion and an external portion of the semiconductor integrated circuit. Especially, latch-up occurs as a result of an external signal and a power supply noise in the input-output circuit portion.

A conventional input-output circuit portion is made up of a pad portion for a wire-bonding and a CMOS circuit. The conventional semiconductor integrated circuit can prevent latch-up using a well known guard-ring. The well known guard-ring has been disclosed in "VLSI SHISUTEMU SEKKEI-KAIRO TO JISSO NO KISO, KISABURO NAKAZAWA et al, Mar. 30, 1995, MARUZEN, pp. 54–56". The guard-ring is formed around transistors of the input-output circuit portions.

Concretely, a p+ guard-ring is electrically connected to a ground potential Vss line, which is formed around respective N-channel MOS transistors of the input-output circuit portions, and an n+ guard-ring is electrically connected to a power supply voltage VDD line, which is formed around respective P-channel MOS transistors of the input-output circuit portions. Further, the guard-ring is formed between the input-output circuit portion and the core portion. The guard-ring is used to decrease a resistivity of a well layer and a resistivity of a semiconductor substrate.

SUMMARY OF THE INVENTION

An object of the present invention is to provide a semiconductor integrated circuit, a layout method of a semiconductor integrated circuit, and a layout apparatus of a semiconductor integrated circuit that can prevent latch-up between the respective input-output circuit portions without changing the layout of the respective input-output circuit portions.

According to one aspect of the present invention, for achieving the above object, there is provided a semiconductor integrated circuit comprising: a core portion; a plurality of input-output circuit portions which are formed on the periphery of the core portion and which are formed at inconstant intervals; a first guard-ring formed within one of the input-output circuit portions; and a second guard-ring formed between the individual input-output circuit portions.

According to one aspect of the present invention, for achieving the above object, there is provided a layout method of a semiconductor integrated circuit, comprising the steps of: providing a core portion; providing a plurality of input-output circuit portions which are formed on the periphery of the core portion; providing a first guard-ring, formed within one of the input-output circuit portions; determining intervals between the respective input-output circuit portions; and forming a second guard-ring between the respective input-output circuit portions when the actual size of the intervals are determined to be above a predetermined size.

According to one aspect of the present invention, for achieving the above object, there is provided a layout apparatus of a semiconductor integrated circuit, comprising: a layout circuit for performing a layout of a plurality of input-output circuit portions; an interval detecting circuit for detecting intervals between the respective input-output circuit portions; and a guard-ring layout circuit for performing a layout of a second guard-ring between the respective input-output circuit portions in response to the detected result.

BRIEF DESCRIPTION OF THE DRAWINGS

While the specification concludes claims particularly pointing out and distinctly claiming the subject matter that is regarded as the invention, the invention, along with the objects, features, and advantages thereof, will be better understood from the following description taken in connection with the accompanying drawings, in which:

DETAILED DESCRIPTION OF THE PREFERRED EMBODIMENTS

A semiconductor integrated circuit according to a preferred embodiment of a present invention will hereinafter be described in detail with reference to the accompanying drawings.

Figure 1:
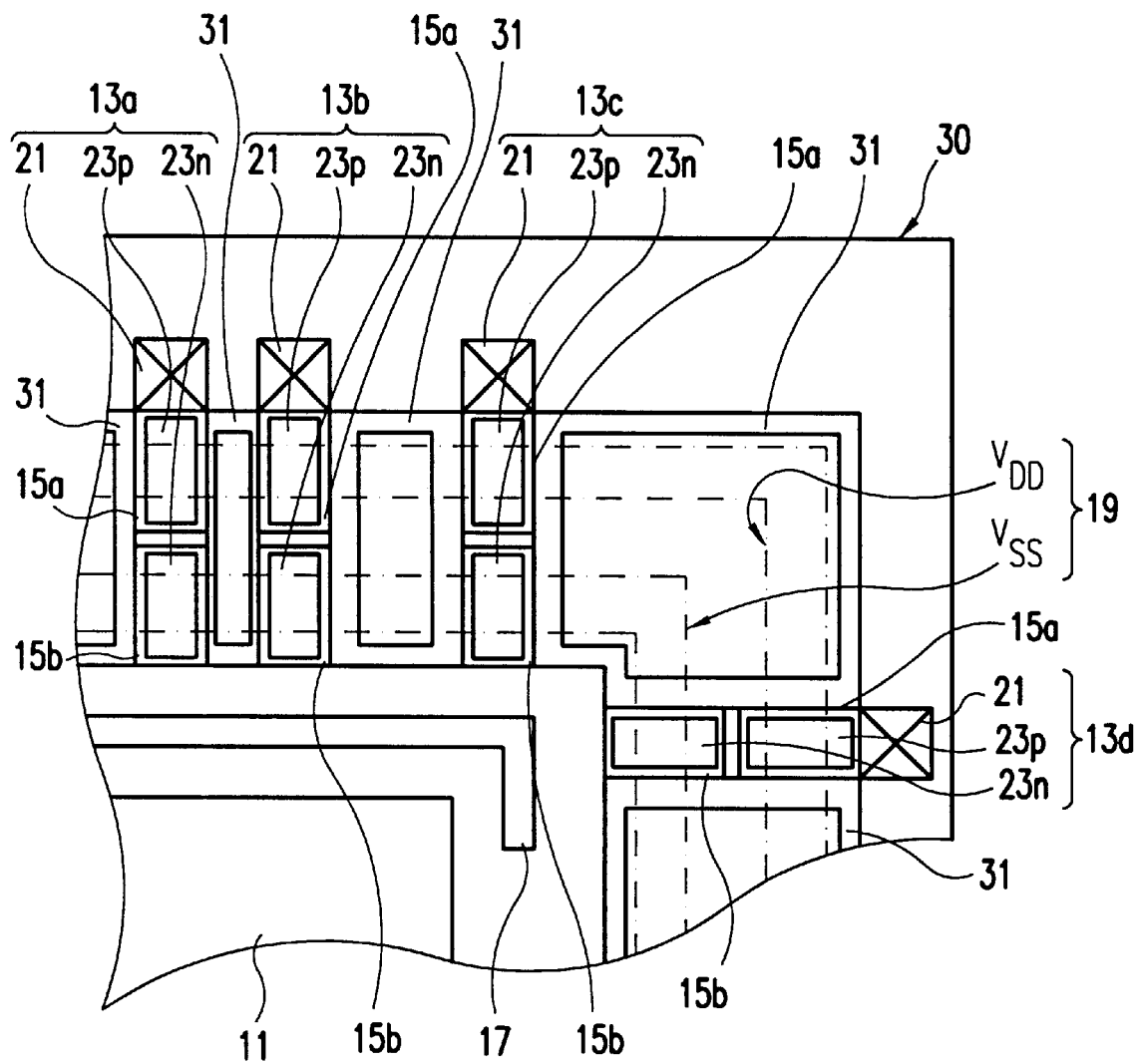
FIG. 1 is a plane view showing a semiconductor integrated circuit according to a preferred embodiment of the present invention.

FIG. 1 is a plane view showing a semiconductor integrated circuit according to a preferred embodiment of a present invention.

As shown in FIG. 1, in a layout of a semiconductor integrated circuit 30, each of the input-output circuit portions 13a~13d is located in consideration of the size and a package type of the chip. As a result, intervals between the adjacent input-output circuit portions 13a~13d are not regular.

Each of p+ guard-rings 15b is electrically connected to a ground potential Vss line 19, which is formed around respective N-channel MOS transistors 23n of the input-output circuit portions 13a~13d. Each of n+ guard-rings 15a is electrically connected to a power supply voltage VDD line 19, which is formed around a respective P-channel MOS transistors 23p of the input-output circuit portions 13a~13d. Further, the guard-ring 17 is formed between the input-output circuit portion 13a~13d and the core portion 11. Further, a guard-ring 31 is formed in the respective intervals between the respective input-output circuit portions 13a~13d.

Figure 2A:
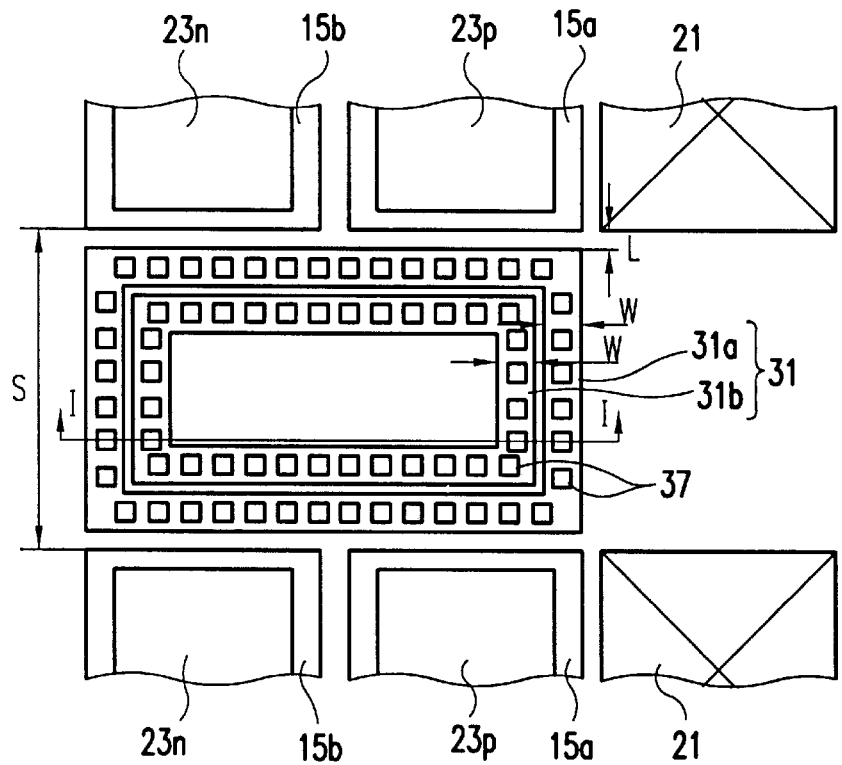
FIG. 2A is a plane view showing a guard-ring according to the preferred embodiment of the present invention.
Figure 2B:
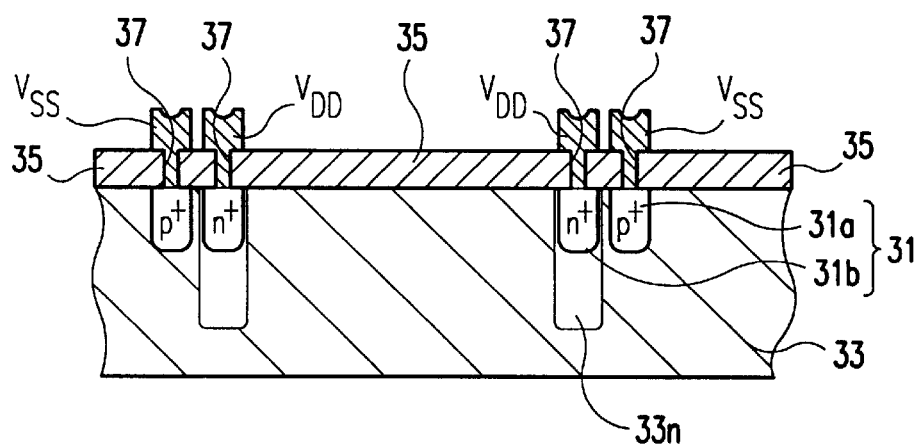
FIG. 2B is a view taken on line I—I of FIG. 2A.

FIG. 2A is a plane view showing a guard-ring according to the preferred embodiment of the present invention. FIG. 2B is a view taken on line I—I of FIG. 2A. In this manner, a guard-ring 31 is preferably made up of a p+ guard-ring 31a and an n+ guard-ring 31b, both of which are formed over a p+ silicon substrate 33. The p+ guard-ring 31a is preferably made up of a p+ layer shaped like a square-ring, which is electrically connected to the ground potential Vss line 19 via a through-hole 37 formed in an insulating layer 35. The n+ guard-ring 31b is preferably made up of a n+ well 33n and an n+ layer formed in the n+ well 33n shaped like a square-ring and, which is electrically connected to the power supply voltage VDD line 19 via a through-hole 37 formed in an insulating layer 35. A distance L between the p+ guard-ring 31a and the n+ guard-ring 31b and a width W between the p+ guard-ring 31a and the n+ guard-ring 31b, as well as the number of the through-holes 37 can all be determined to satisfy any given layout standard.

As mentioned above, the semiconductor integrated circuit of the invention is formed of suitable guard-rings placed in the respective intervals between the respective input-output circuit portions. As a result, the semiconductor integrated circuit of the invention can prevent latch-up between the respective input-output circuit portions without changing the layout of the respective input-output circuit portions.

Figure 3:
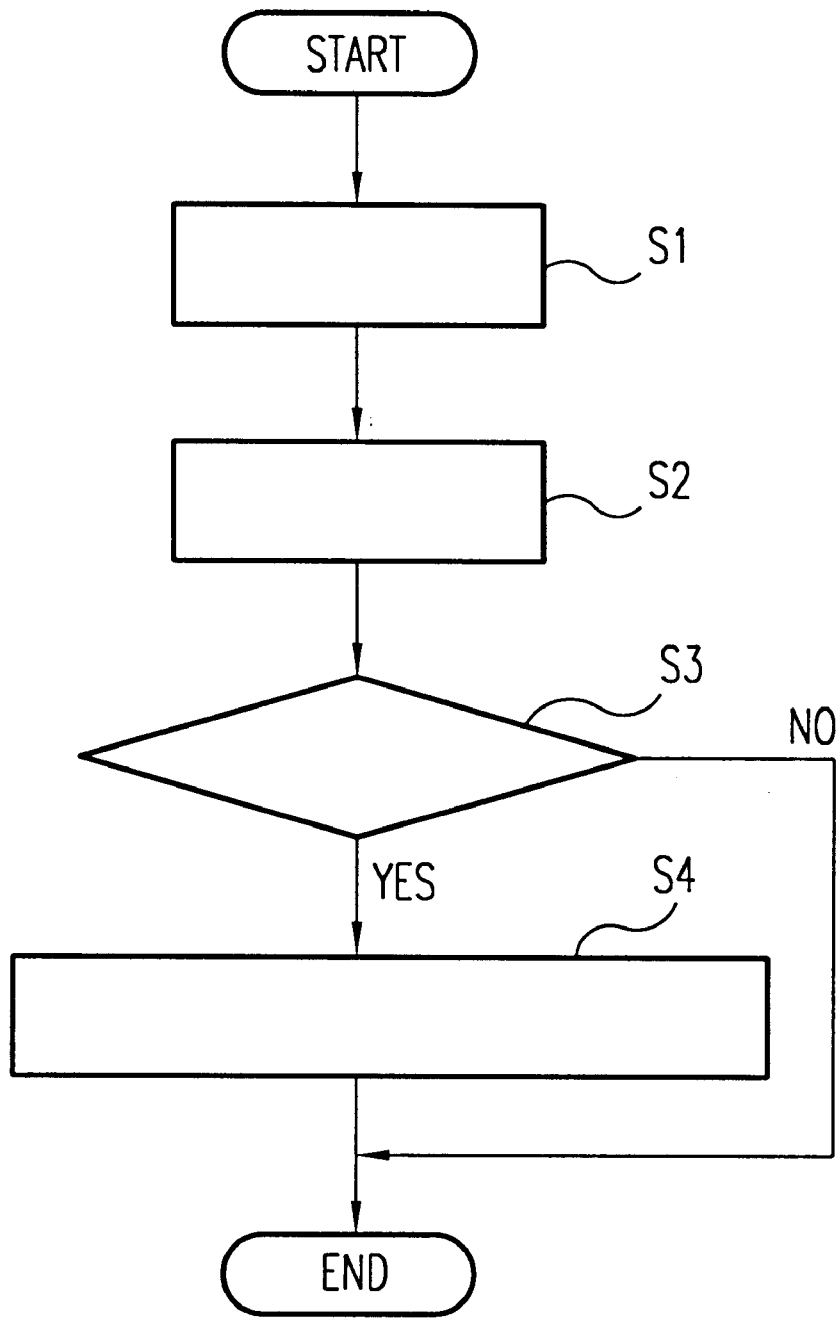
FIG. 3 is a flow-chart showing a layout method of a semiconductor integrated circuit according to a preferred embodiment of the present invention.

FIG. 3 is a flow-chart showing a layout method of a semiconductor integrated circuit according to a preferred embodiment of a present invention.

In step S1, a layout of a semiconductor integrated circuit including input-output circuit portions is performed using a well-known layout apparatus, for example using computer-aided design (CAD). Here, the layout of the semiconductor integrated circuit is determined, including input-output circuit portions, which are designed in a suitable location depending upon chip size and package type.

In step S2, a layout standard is determined for forming guard-rings in the respective intervals between the respective input-output circuit portions. Then, the standard is then inputted to the layout apparatus. Here, the layout standard is used for placing the guard-rings, and includes, for example, diameters of through-holes and widths of metal interconnection.

In step S3, the respective interval size of the adjacent input-output circuit portions is detected by the layout apparatus. Here, the detecting method of the respective interval size of the adjacent input-output circuit portions is performed by comparing the coordinate data of the respective input-output circuit portions to the predetermined interval size data of the layout standard. The layout apparatus recognizes that there is not a suitable interval between the input-output circuit portions i.e., when the interval size of the adjacent input-output circuit portions is less than the critical value that can form the guard-ring in consideration of the layout standard, as the predetermined interval size data, then the layout apparatus doesn't form the guard-ring there and the process ends.

On other hand, the layout apparatus recognizes in step S3 that there is a suitable interval between the input-output circuit portions i.e., when the interval size of the adjacent input-output circuit portions is more than the critical value, then the layout apparatus forms the guard-ring there as shown in step S4. Here, the predetermined interval size data may use experimental data or data based on experience which can prevent latch-up, instead of the critical value.

Figure 4:
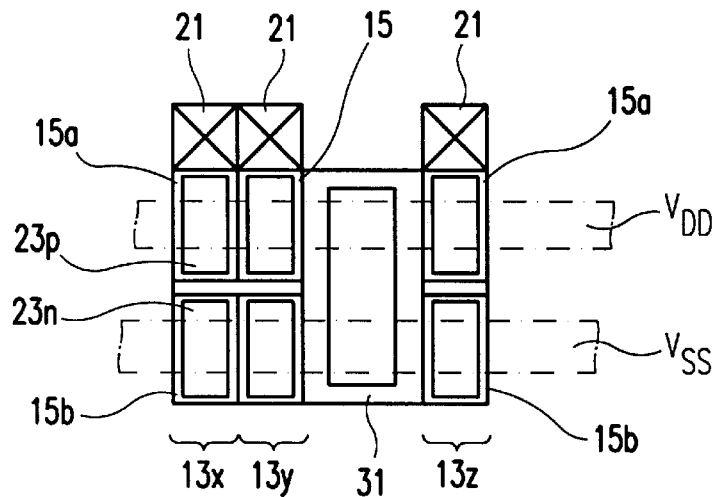
FIG. 4 is a plane view showing the semiconductor integrated circuit designed using the layout method according to a preferred embodiment of the present invention.

FIG. 4 is a plane view showing the semiconductor integrated circuit designed using the layout method according to a preferred embodiment of the present invention.

As shown in FIG. 4, the layout apparatus recognizes that there is not suitable interval between the input-output circuit portions 13x and 13y i.e., the interval size of the adjacent input-output circuit portion is less than the critical value that can form the guard-ring in consideration of the layout standard. However, the layout apparatus recognizes that there is a suitable interval between the input-output circuit portions 13y and 13z i.e., the interval size of the adjoined input-output circuit portion is more than the critical value that can form the guard-ring in consideration of the layout standard. As a result, a guard-ring 31 is formed in the interval between the input-output circuit portions 13y and 13z, and isn't formed in the interval between the input-output circuit portions 13x and 13y.

As mentioned above, the layout method of the semiconductor integrated circuit according to the preferred embodiment of the present invention can automatically prevent latch-up in the input-output circuit portions located at inconstant intervals.

Figure 5:
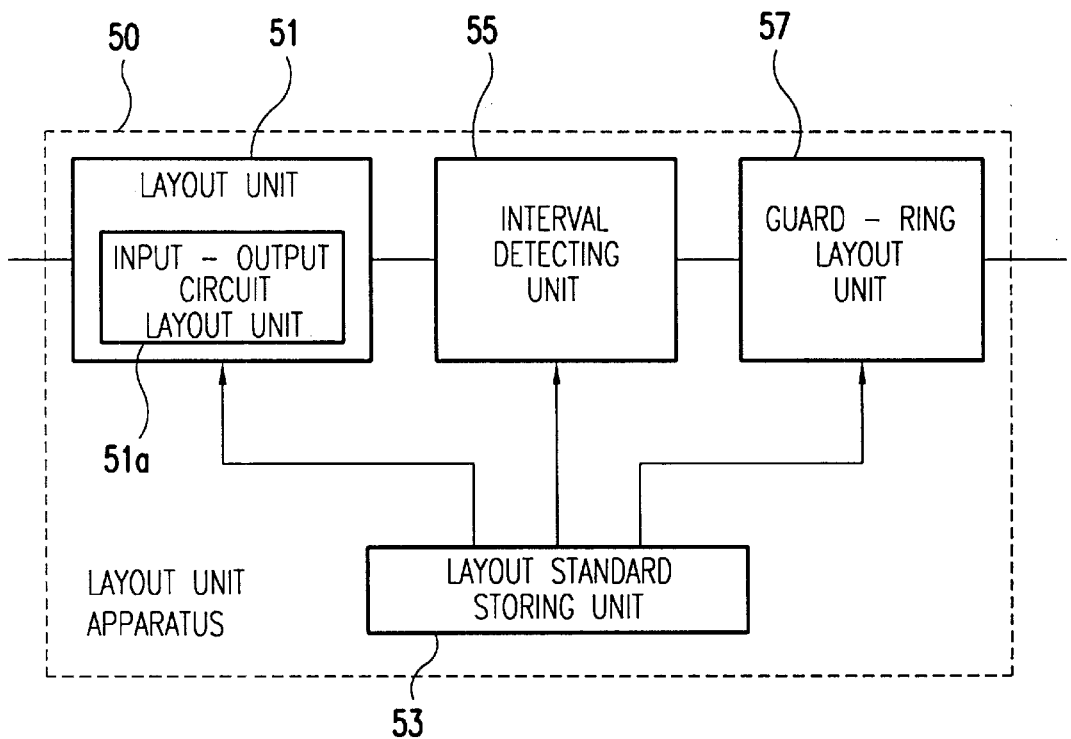
FIG. 5 is a block diagram showing a layout apparatus of a semiconductor integrated circuit according to a preferred embodiment of the present invention.

FIG. 5 is a block diagram showing a layout apparatus of a semiconductor integrated circuit according to a preferred embodiment of the present invention.

The layout apparatus 50 preferably comprises a layout unit 51, a layout standard storing portion 53, an interval detecting unit 55, and a guard-ring layout unit 57. The layout unit 51 includes an input-output circuit layout unit 51a, which comprises a well-known CAD. The layout standard storing unit 53 stores layout standards for the interval detecting unit 55 and the guard-ring layout unit 57, and comprises a program storage device or an external storage device included in the CAD. The interval detecting unit 55 recognizes whether or not a suitable interval is present between adjacent input-output circuit portions, and is made up of a computer in the CAD.

Here, the interval between adjoining input-output circuit portions is calculated by a coordinate data of the input-output circuit portions layout. The interval detecting unit 55 generates a signal that the interval size of the adjoined input-output circuit portions is less or more than the critical value that can form the guard-ring in consideration of the layout standard, i.e., the predetermined interval size data, and then outputs the signal to the guard-ring layout unit 57. The guard-ring layout unit 57 designs a guard-ring in a region between the adjacent input-output circuit portions in response to the signal from the interval detecting unit 55 that the interval size of the adjacent input-output circuit portions is less or more than the critical value that can form the guard-ring in consideration of the layout standard stored in the layout standard storing unit 53. The guard-ring layout unit 57 comprises a computer in the CAD.

As the mentioned above, the layout method of the semiconductor integrated circuit according to the preferred embodiment of the present invention can automatically prevent the latch-up in the input-output circuit portions located at inconstant intervals.

While the present invention has been described with reference to the illustrative embodiments, this description is not intended to be construed in a limiting sense. Various modifications of the illustrative embodiments, as well as other embodiments of the invention, will be apparent to those skilled in the art on reference to this description. It is therefore contemplated that the appended claims will cover any such modifications or embodiments as fall within the true scope of the invention.

What is claimed is:

1. An apparatus for determining a circuit layout of a semiconductor integrated circuit design, said apparatus comprising:

a layout circuit which determines respective locations of a plurality of input-output circuit portions such that the plurality of input-output circuit portions are aligned side by side within the semiconductor integrated circuit design;

an interval detecting circuit which determines a dimension of each of interval regions located between respective adjacent pairs of the input-output circuit portions within the semiconductor integrated circuit design; and a guard-ring layout circuit which is responsive to the interval detecting circuit to determine a location of a guard-ring within at least one of the interval regions within the semiconductor integrated circuit design.

2. An apparatus as recited in claim 1, wherein said guard-ring layout circuit determines the location of a guard-ring within each of the interval regions that exceeds a predetermined dimension.

3. An apparatus as recited in claim 1, wherein the layout circuit determines respective locations of a plurality of input-output circuit portions such that the plurality of the input-output circuit portions are formed at irregular intervals between a core portion and an external portion within the semiconductor integrated circuit design.

4. An apparatus as recited in claim 3, wherein the core portion comprises semiconductor circuits within the semiconductor integrated circuit design.

5. An apparatus as recited in claim 1, wherein the respective input-output circuit portions each comprise a pad portion for a wire-bonding and a CMOS circuit within the semiconductor integrated circuit design.

6. A layout apparatus of a semiconductor integrated circuit as recited in claim 1, wherein the semiconductor integrated circuit design includes a power supply line.

7. An apparatus as recited in claim 6, wherein the power supply line is electrically connected to the guard-ring within the semiconductor integrated circuit design.

8. An apparatus as recited in claim 1, wherein another guard-ring is located within each of the input-output circuit portions within the semiconductor integrated circuit design.

* * * * *